(12) United States Patent
Kanamaru et al.

(10) Patent No.: US 9,890,037 B2
(45) Date of Patent: Feb. 13, 2018

(54) PHYSICAL QUANTITY SENSOR

(71) Applicant: Hitachi Automotive Systems, Ltd., Hitachinaka-shi, Ibaraki (JP)

(72) Inventors: Masatoshi Kanamaru, Tokyo (JP); Masahide Hayashi, Ibaraki (JP); Masashi Yura, Ibaraki (JP); Heewon Jeong, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/502,554

(22) PCT Filed: Jun. 29, 2015

(86) PCT No.: PCT/JP2015/068606
§ 371 (c)(1),
(2) Date: Feb. 8, 2017

(87) PCT Pub. No.: WO2016/038984
PCT Pub. Date: Mar. 17, 2016

(65) Prior Publication Data
US 2017/0233246 A1    Aug. 17, 2017

(30) Foreign Application Priority Data
Sep. 9, 2014    (JP) .................................. 2014-182853

(51) Int. Cl.
*B81B 7/00*    (2006.01)
*G01C 19/574*    (2012.01)

(52) U.S. Cl.
CPC .......... *B81B 7/0064* (2013.01); *G01C 19/574* (2013.01); *B81B 2201/0235* (2013.01);
(Continued)

(58) Field of Classification Search
CPC .......... B81B 7/0064; B81B 2201/0235; B81B 2201/0242; B81B 2201/0264; B81B 2201/045; B81B 2203/0136; G01C 19/574
See application file for complete search history.

(56) References Cited

U.S. PATENT DOCUMENTS 6,847,907 B1 *   1/2005   Novotny ............. B81C 99/0045
                                                   438/17
2010/0263446 A1   10/2010  Tamura et al.
(Continued)

FOREIGN PATENT DOCUMENTS

JP    2002-162410 A    6/2002
JP    2002-162411 A    6/2002
(Continued)

OTHER PUBLICATIONS

International Search Report (PCT/ISA/210) issued in PCT Application No. PCT/JP2015/068606 dated Oct. 6, 2015 with English translation (5 pages).
(Continued)

*Primary Examiner* — Fernando L Toledo
*Assistant Examiner* — Neil Prasad
(74) *Attorney, Agent, or Firm* — Crowell & Moring LLP

(57) ABSTRACT

For a small sensor produced through a MEMS process, when an electrode pad, wiring, or a shield layer is formed in a final step, it is difficult to nondestructively investigate whether a structure for sensing a physical quantity has been processed satisfactorily. In the present invention, in a physical quantity sensor formed from an MEMS structure, in a structure in which a surface electrode having through wiring is formed on the surface of an electrode substrate and the periphery thereof is insulated, forming a shield layer comprising a metallic material on the surface of the electrode substrate in a planar view and providing a space for internal observation (Continued)

inside the shield layer makes it possible to check for internal defects.

6 Claims, 5 Drawing Sheets

(52) U.S. Cl.
CPC ............... *B81B 2201/0242* (2013.01); *B81B 2201/0264* (2013.01); *B81B 2201/045* (2013.01); *B81B 2203/0136* (2013.01)

(56) References Cited

U.S. PATENT DOCUMENTS

2011/0315526 A1\* 12/2011 Jahnes ............... B81C 1/00365
200/181

2015/0197419 A1\* 7/2015 Cheng .................. B81B 7/0006
257/418
2016/0060103 A1\* 3/2016 Hung .................... B81B 7/0038
257/415

FOREIGN PATENT DOCUMENTS

| JP | 2007-80985 A | 3/2007 |
| JP | 2010-190703 A | 9/2010 |
| JP | 2012-186285 A | 9/2012 |
| WO | WO 2009/087858 A1 | 7/2009 |

OTHER PUBLICATIONS

Japanese-language Written Opinion (PCT/ISA/237) issued in PCT Application No. PCT/JP2015/068606 dated Oct. 6, 2015 (3 pages).

\* cited by examiner

PHYSICAL QUANTITY SENSOR

TECHNICAL FIELD

The present invention relates to a structure a physical quantity sensor used for measuring a physical quantity and especially relates to a structure of a physical quantity sensor using a MEMS device such as a sensor to detect an acceleration, a sensor to detect an angular rate, a pressure sensor, and an optical switch.

BACKGROUND ART

In recent years, by development of a refining technique by a MEMS technique, various sensors which measure a physical quantity such as an acceleration and an angular rate and include such as a silicon material and a glass material.

A physical quantity sensor using the MEMS technique can advantageously form a structure with a high aspect ratio (a ratio between an opening width and a processing depth) in comparison with a semiconductor device. In addition, a three-dimensional structure and a movable structure including silicon by a dry etching method using a reactive ion etching (RIE) device using an induction coupled plasma (ICP) system which can form a groove with a high aspect ratio, and therefore, in comparison with machining, each type structure with high processing accuracy can be formed. Such a minute movable structure can be driven by a static electricity. Therefore, a shield structure is needed to accurately control the minute structure or to detect a physical quantity. Further, it is important to confirm whether the minute structure is processed according to a design size.

As a physical quantity sensor using such the MEMS technique, a dynamic quantity sensor element described in JP 2007-80985 A (PTL 1) is known. The dynamic quantity sensor element is a structure which shields noise in a detecting unit lowly resistant to noise by a silicon shield substrate and a shielding portion. The shielding portion is formed on a front surface and an inner surface of a base substrate. Further, silicon is used in the detecting elements, and a glass substrate is used in a lower surface and an upper surface. The above-described dynamic quantity sensor detects an acceleration and an angular rate by a detecting unit.

Further, JP 2012-186285 A (PTL 2) describes an invention relating to an inspection method for a through wiring board and an electronic component which can observe the inside of a through hole. A conductive pattern covering an opening provided at an upper portion of a through hole is arranged, and a cut out portion is formed at a part of the conductive pattern. Consequently, an edge of the opening can be observed. A displacement can be observed by moving a position for forming the cut out portion. A lower side of the through hole is expanding.

CITATION LIST

Patent Literature

PTL 1: JP 2007-80985 A
PTL 2: JP 2012-186285 A

SUMMARY OF INVENTION

Technical Problem

A dynamic quantity sensor element described in PTL 1 has a shield structure by a metal film so as to surround a detecting element of an acceleration sensor. Therefore, a structure of the acceleration sensor cannot be observed after being assembled, and provably it would not possible to confirm whether the acceleration sensor is satisfactory processed.

In the structure described in PTL 2, a cut out hole is formed directly to a through hole. Therefore, the inside of the through hole is held only by atmospheric pressure. In addition, since a through hole is formed, a wiring may be deteriorated, and foreign objects may be mixed, due to water intrusion into the through hole.

An object of the present invention is to provide a physical quantity sensor capable of nondestructively and easily confirming and observing a defect in a minute structure while maintaining a shield effect on an electrode substrate surface.

Solution to Problem

To achieve the above object, a physical quantity sensor according to the present invention has a two-layer structure in which at least two substrates including a fixed substrate and an electrode substrate. In a structure in which a surface electrode of a through wiring is formed on an electrode substrate surface, and a periphery of the surface electrode is insulated, an inside observation space is provided in a shield layer including a metal material formed on an electrode substrate surface with plan view. As a result, electromagnetic waves generated from a surface electrode of a through wiring or a through electrode can be prevented, and an inside structure can be confirmed and observed.

Advantageous Effects of Invention

According to the present invention, by providing an inside observation space at a part of a shield electrode formed on a whole surface of an electrode substrate, noise generated in each electrode portion or between wirings can be removed, and a defect of a structure of such as comb teeth formed in a device layer can be confirmed. Consequently, a highly reliable physical quantity sensor can be provided.

An issue, a configuration, and an effect other than the above are clarified by descriptions of the following embodiments.

DESCRIPTION OF EMBODIMENTS

Embodiments of the present invention will be described below.

(First Embodiment)

Figure 1:
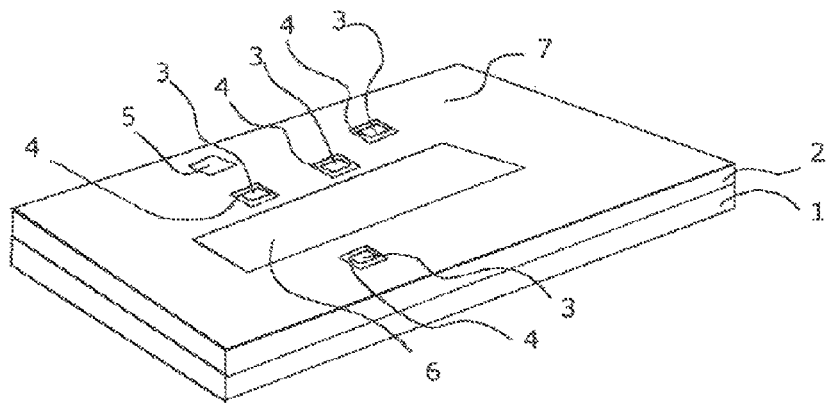
FIG. 1 is an external view describing a physical quantity sensor according to the present invention.

A structure according to a first embodiment of a physical quantity sensor according to the present invention will be described with reference to FIG. 1. FIG. 1 illustrates an external appearance view of a physical quantity sensor indicating an example of the present invention. An acceleration sensor is exemplified in the embodiment. A substrate has a two-layer structure including a fixed substrate 1 and an electrode substrate 2. A plurality of through hole surface electrodes 3 is disposed on a surface of the electrode substrate 2, and the periphery of the through hole surface electrode 3 is insulated by a space 4, and a shield layer 7 is formed on an electrode substrate surface. The shield layer 7 is connected to an earth electrode 5. An inside observation space 6 is formed at a part of the shield layer 7. The physical quantity sensor is electrically connected to an electrode pad formed in a control LSI by using a metal wire. A silicon-on-insulator (SOI) wafer is used in the fixed substrate 1, and a glass substrate is used in the electrode substrate 2.

A role of the shield layer 7 is to remove electrical noise by electromagnetic waves from the through hole surface electrode 3 and to block electric noise generated by electromagnetic waves existing outside.

Figure 2:
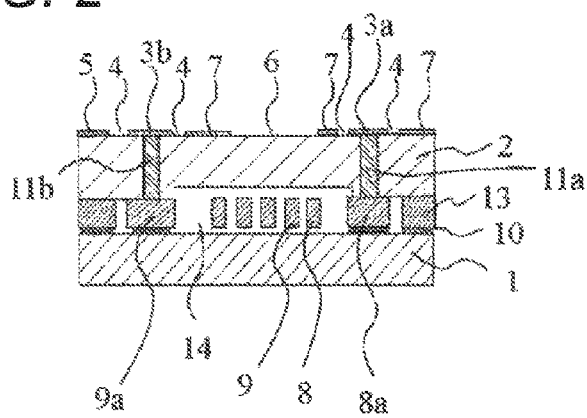
FIG. 2 is a sectional view describing the physical quantity sensor according to the present invention.

Next, a cross-section structure illustrated in FIG. 1 will be described with reference to FIG. 2. An insulating film 10 including SiO2 is formed in the fixed substrate 1, and a device layer 13 is formed on the insulating film 10 of oxide film. The electrode substrate 2 is disposed at an upper portion of the device layer 13. Through electrodes 11a and 11b are formed in the electrode substrate 2. A fixed electrode 8a formed in the device layer 13 is electrically connected to a through hole surface electrode 3a formed on the electrode substrate 2 by the through electrode 11a. Similarly, a movable electrode 9a formed in the device layer 13 is electrically connected to a through hole surface electrode 3b formed in the electrode substrate 2 by the through electrode 11b. A fixed electrode 8a is electrically connected to a fixed comb tooth 8. A movable electrode 9b has a structure electrically connected to a movable comb tooth 9. A material of a through electrode 11 is preferably a metal material and formed by a plating method. Further, a device layer is formed by low-resistance silicon material of 10 to 20 Ωcm.

Sensing of an acceleration as a physical quantity can be performed by using a change in a gap between the fixed electrode 8 and the movable electrode 9 when an acceleration is applied. An acceleration is detected by detecting the variation of the gap between electrodes by the acceleration by an electrostatic force.

A sensing space 14 in the device layer 13 is a sealed space by the fixed substrate 1 and the electrode substrate 2. In the sensing space 14, a pressure atmosphere is approximately 10000 Pa to 50000 Pa. The pressure atmosphere in the sensing space 14 of an acceleration sensor is sealed at a vacuum degree of approximately 10000 Pa to 50000 Pa. This is because as a temperature increases, a pressure in a sealed space increases, according to a bonding temperature in the sealed space. In this case, the case where sealing might be peeled depending on a bonding method. Therefore, it is necessary to make a depressurized state in advance. As a bonding method of the fixed substrate 1 and the electrode substrate 2, anode bonding is preferable. However, in addition to the anode bonding, each metal bonding method such as eutectic bonding of gold and silicon, eutectic bonding of gold and tin, and eutectic bonding of aluminium and germanium can be used.

In the sensing space 14 of the acceleration sensor, a damping effect may be improved by sealing a gas having a large molecular weight, such as argon, xenon, and krypton.

Further, a gap between the movable comb tooth 9 and the fixed comb tooth 8 is several microns. In a minute comb tooth structure formed in this manner, it is necessary to confirm after assembly whether the several-micron gap between comb teeth is highly precisely processed and whether comb teeth are not stuck each other. In the present invention, the inside observation space 6 is provided at a part of the shield layer 7. Therefore, it is possible to nondestructively observe by an optical microscope whether minute comb teeth are sufficiently processed. In other words, the shield layer 7 includes a slit (a region in which the shield layer 7 is not provided) or a thin wall portion such that inspection light can transmit in a region in which the fixed comb tooth 8 and the movable comb tooth 9 are projected in a lamination direction with respect to the shield layer 7. Specifically, the shield layer 7 can include a peep portion to observe inside. In further other words, the electrode substrate 2 does not include the shield layer 7 or includes the shield layer 7 which is thinner than other regions, in a region in which the fixed comb tooth 8 and the movable comb tooth 9 are projected in a lamination direction with respect to the electrode substrate 2 According to the embodiment, since the shield layer 7 includes a peep portion, it is possible to provide a physical quantity sensor which can nondestructively and easily confirm or observe a defect of a minute structure which is a sensing portion, while maintaining a shield effect on an electrode substrate surface. A material of the shield layer is preferably aluminum, and aluminum may include silicon at a rate of approximately 0.5%. Further, other metal material may be used.

(Second Embodiment)

Figure 3:
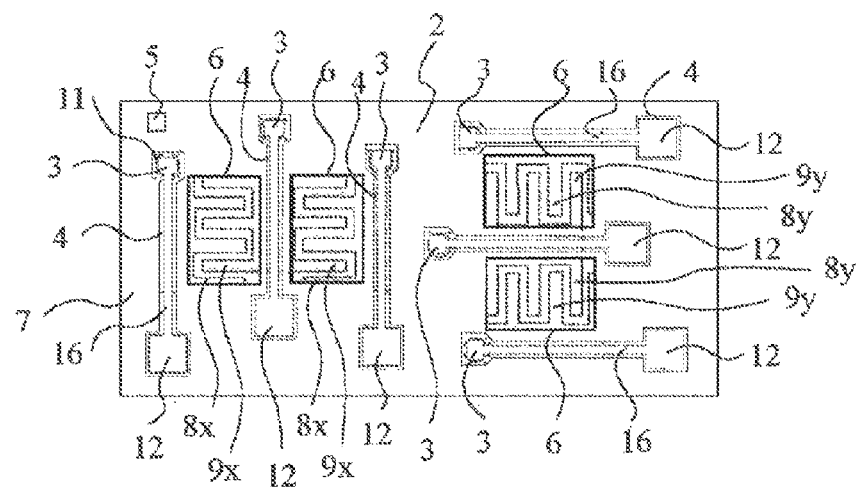
FIG. 3 is an elevation view describing a physical quantity sensor according to a second embodiment of the present invention.

A structure according to a second embodiment of the physical quantity sensor according to the present invention will be described with reference to FIG. 3. Descriptions overlapping in the first embodiment will be omitted. FIG. 3 is an elevation view of the physical quantity sensor indicating another example of the present invention. In FIG. 3, two-shaft acceleration sensor is formed on one substrate. Specifically, an acceleration in two directions of an X axis and a Y axis can be detected. The X axis is a parallel direction, and the Y axis is a vertical direction in the elevation view.

On a surface of an electrode substrate 2, a plurality of through hole surface electrodes is disposed which electrically connected to a through electrode 11 (indicated by a broken line). The through hole surface electrodes 3 are electrically connected to electrode pads 12 for electrically connecting to a control LSI by wirings 16. A shield layer 7 is formed on a surface of the electrode substrate 2. The wiring 16 is electrically insulated from the shield layer 7 by a space 4 provided around the wiring. The shield layer 7 is connected to an earth electrode 5. In the embodiment, a plurality of inside observation spaces 6 is formed in a part of the shield layer 7.

In the case where a glass material is used in the electrode substrate 2, fixed comb teeth 8x and movable comb teeth 9x are nondestructively observed from the inside observation space 6 by an optical microscope. Similarly, fixed comb teeth 8y and movable comb teeth 9y can be nondestructively observed. Further, in the case where a silicon material is used in the electrode substrate 2, the fixed comb teeth 8x and the movable comb teeth 9x can be nondestructively observed from the inside observation space 6 by an infrared microscope or a confocal infrared laser microscope. Similarly, fixed comb teeth 8y and movable comb teeth 9y can be nondestructively observed. In the case where the silicon material is used in the electrode substrate 2, an insulating film is disposed under the shield layer 7.

Here, in the case where a current flows in the wiring 16, electromagnetic waves are generated around the wiring 16. For example, in the case a shield layer is not provided between wirings, the wirings are affected each other by noise caused by the electromagnetic waves, and data of such as an electrostatic force in which an acceleration is detected may not be normally obtained.

Figure 4:
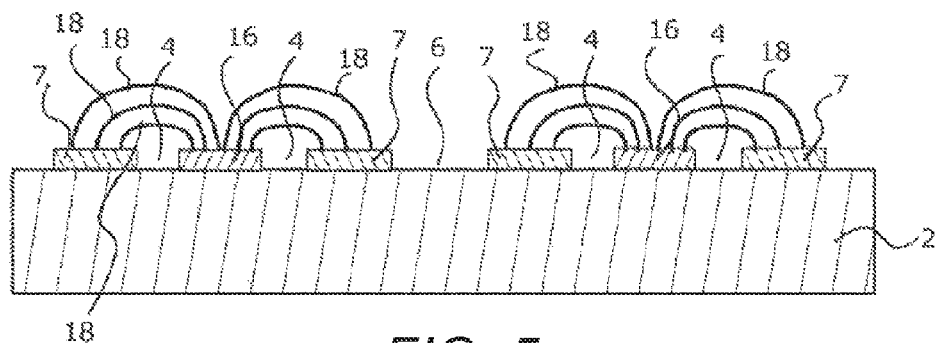
FIG. 4 is a sectional view describing a shield effect according to the present invention.

Next, a shield effect according to the embodiment will be described with reference to FIG. 4. FIG. 4 illustrates line-of-electric forces 18 of electromagnetic waves generated from the wirings 16 in the case where the wirings 16 and the shield layers 7 are formed on a surface of the electrode substrate 2, and a current flows in the wirings 16 in a state in which each of the wirings 16 and the shield layers 7 is electrically blocked by the space 4. According to this structure, an electromagnetism from the wiring 16 can be blocked. Therefore, even if the inside observation space 6 is formed in a part of the shield layer 7, the space is not affected by the wiring. Specifically, a space on an outer side of the shield layer 7 disposed on both sides of the wiring 16, for example, the space 6, is not affected by the electromagnetic waves. This is because the electromagnetic waves generated from the wirings 16 are blocked by the shield layers 7.

Planarly the wiring 16 can pull around to an arbitrary position on a surface of the electrode substrate 2 in addition to vertical and parallel directions. Further, a portion other than the electrode pad 12 and shield layers are protected by a protective film including TEOs SiN, and resin. The protective film around the electrode pad 12 can be formed by a technique similar to a general technique to form a protective film of a semiconductor circuit.

(Third Embodiment)

Figure 5:
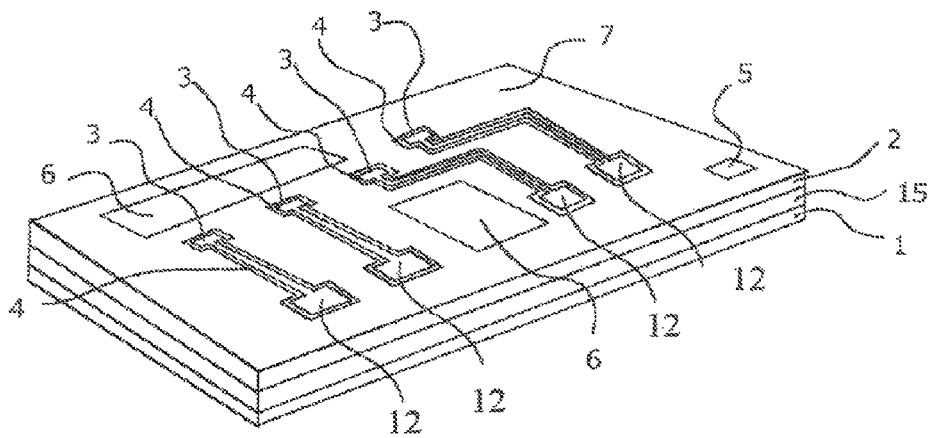
FIG. 5 is an external appearance view describing a physical quantity sensor according to a third embodiment of the present invention.

A structure according to a third embodiment of a physical quantity sensor according to the present invention will be described with reference to FIG. 5. Descriptions overlapping in the first and second embodiments will be omitted. FIG. 5 is an external appearance view of a physical quantity sensor indicating another example of the present invention. An angular rate sensor is exemplified in the embodiment. A substrate at least has a three-layer structure including a fixed substrate 1, a device substrate 15, and an electrode substrate 2. Specifically, the fixed substrate 1 which is a first substrate, the device substrate 13 which is a second substrate, and the electrode substrate 2 which is a third substrate are laminated so as to sandwich the device substrate 13 by the fixed substrate 1 and the electrode substrate 2. A plurality of through hole surface electrodes 3 is disposed on a surface of the electrode substrate 2 and electrically connected to an electrode pad 12 by a wiring 16. The periphery of the through hole surface electrodes 3 is insulated by a space 4, and a shield layer 7 is formed on a surface of the electrode substrate. The shield layer 7 is connected to an earth electrode 5. A plurality of inside observation spaces 6 is formed on a part of the shield layer 7. A silicon material is used in the fixed substrate 1, the device substrate 13, and the electrode substrate 2.

Most preferably, all of the substrates are made of silicon material, and since a linear expansion coefficient of a physical quantity sensor structure becomes equal, a sensor excellent in reliability can be provided.

The shield layer 7 is provided to remove electrical noise by electromagnetic waves generated between wirings pulled around from the through hole surface electrode 3 to the electrode pad 12 and to block electrical noise generated by electromagnetic waves existing outside.

Figure 6:
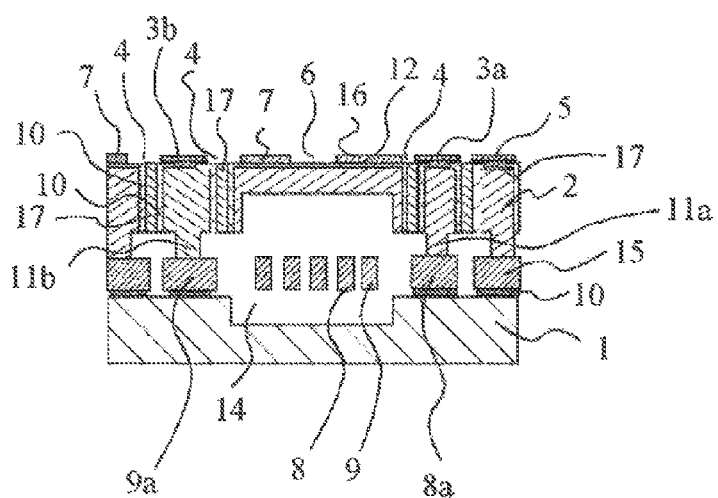
FIG. 6 is a sectional view describing the physical quantity sensor according to the third embodiment of the present invention.

Next, a cross-section structure illustrated in FIG. 5 will be described with reference to FIG. 6. An insulating film 10 including SiO2 is formed on a fixed substrate 1, and a device substrate 15 is formed on the insulating film 10. The electrode substrate 2 is disposed on the device substrate 15. Through electrodes 11a and 11b are formed in the electrode substrate 2. Since the device substrate 15 is electrically communicated to the outside, a fixed electrode 8a formed in the device substrate 15 is electrically connected to a through hole surface electrode 3a formed on the electrode substrate 2 by the through electrode 11a including low-resistance silicon. Similarly, a movable electrode 9a formed in the device substrate 15 is electrically connected to a through hole surface electrode 3b formed on the electrode substrate 2 by the through electrode 11b including low-resistance silicon. The fixed electrode 8a is electrically connected to a fixed comb tooth 8. A movable electrode 9b is electrically connected to a movable comb tooth 9.

Peripheries of the through electrodes 11a and 11b including low-resistance silicon and formed in the electrode substrate 2 are electrically insulated by an oxide film 10 such as SiO2, and peripheries of the peripheries are sealed by a filling material 17 such as Poly-Si.

Sensing of an angular rate as a physical quantity is performed by using a Coriolis force generated by applying an angular rate in the case where a plurality of movable comb teeth 9 is driven (oscillated) at a natural frequency. A gap between electrodes of the fixed comb tooth 8 and the movable comb tooth 9 is varied by the Coriolis force. An angular rate is detected by detecting a variation of the gap between electrodes by the Coriolis force by an electrostatic force.

In this structure, a gap, such as a groove, is formed on the fixed substrate 1 before the substrate is bonded, and the device substrate 15 is bonded after the oxide film 10 is formed on the fixed substrate 1 on which the groove has been formed. Then, a device pattern and a gap of several microns are formed by a dry etching process with a high aspect ratio. At this time, if a thickness of the oxide film 10 formed on the fixed substrate 1 is thin, the oxide film 10 on a groove surface of the fixed substrate 1 is reduced during the dry etching process with a high aspect ratio, and a minute gap structure in which a device patterns transferred is formed on a groove bottom surface. More specifically, the groove is formed on a part of the oxide film 10, or the oxide film is eliminated, and silicon is etched. Finally, the three-layer structure is completed by bonding the electrode substrate 2, on which the groove is formed, on the device substrate 15. Three or more substrates may be laminated.

Direct bonding of silicon is used to bond the fixed substrate 1 and the device substrate 15 and to bond the device substrate 15 and the electrode substrate 2. By the direct bonding of silicon, first, a hydrophilic treatment is performed on a silicon wafer or a silicon wafer in which an oxide film is formed on a surface, and the silicon wafers are stuck at about room temperature. Consequently, two silicon wafers stuck by hydrogen-bond are bonded. In this state, a bonding intensity is still week. Therefore, a heating process is performed at a temperature of 900 to 1150° C. By the heating process, a siloxane bond state is created, and finally a strong bond state between silicon and silicon is obtained. In addition, a metal bonding method such as eutectic bonding of gold and silicon, eutectic bonding of gold and tin, and eutectic bonding of aluminium and germanium can be used.

As above described, even if a gap having a different depth is formed by an etching process, it is difficult to observe the gap from the fixed substrate 1 side. In addition, generally, the fixed substrate 1 has a thickness of approximately 600 to 800 microns to pass a process line. Therefore, it is difficult to inspect by infrared rays from the fixed substrate 1 side.

For example, in the case where a thickness of laminated substrates is thin, and it is necessary to use a shield structure on the fixed substrate 1 side, the inside observation space 6 may be provided on the fixed substrate side.

By the inside observation space 6 according to the present invention, it is possible to nondestructively inspect or observe by an infrared microscope or a confocal infrared laser microscope whether comb teeth are sufficiently formed with a gap of several microns, after a minute comb tooth structure formed as described above is assembled.

In a sensing space 14 in which an angular rate of the device substrate 13 is measured, a pressure atmosphere is a vacuum atmosphere of approximately 30 Pa in a sealed space between the fixed substrate 1 and the electrode substrate 2 which are vertically disposed. The fixed electrode (fixed beam) 8 and the movable electrode (movable beam) 9 are formed in the sensing space 14. A plurality of comb teeth is formed with a gap of several microns.

Figure 7:
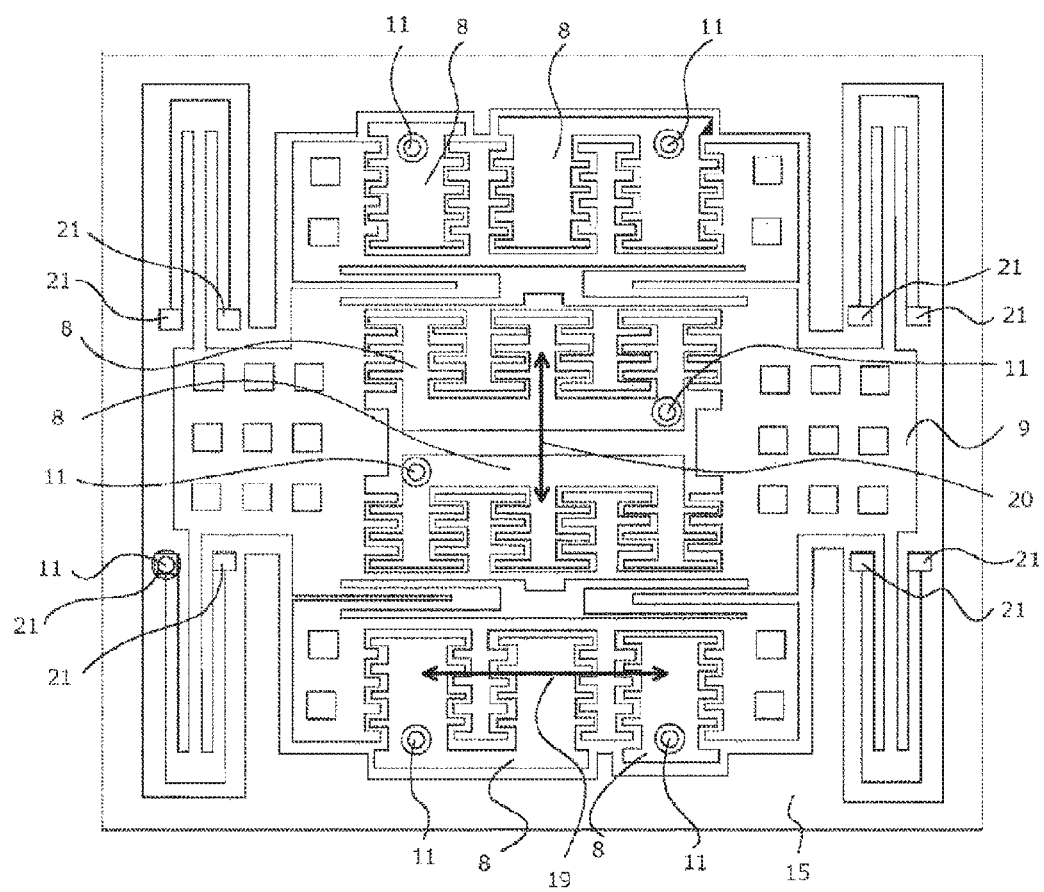
FIG. 7 is an elevation view of a device substrate according to the third embodiment of the present invention.

FIG. 7 illustrates a plan view of a pattern example of the device substrate 15 of an angular rate sensor. The movable electrode 9 and a plurality of the fixed electrodes 8 are disposed in the angular rate sensor. This is to separate a driving unit and a detecting unit. A through electrode 11 is electrically connected to each of the fixed electrodes. The movable electrode 9 is supported by a fixing portion 21, and other portions are floating and therefore can be easily driven by an electrostatic force. Driving is moved in a driving direction 19 in the drawing by a plurality of comb teeth vertically disposed in the drawing. On the other hand, the comb teeth disposed at the center are comb teeth of a detecting unit, and an angular rate is detected, by an electrostatic force, by detecting a variation between a fixed electrode and a movable electrode in the detecting unit in which a Coriolis force is applied. The direction is indicated by a detecting direction 20. A contact, a damage, and a processing shape between these comb teeth are important.

Figure 8:
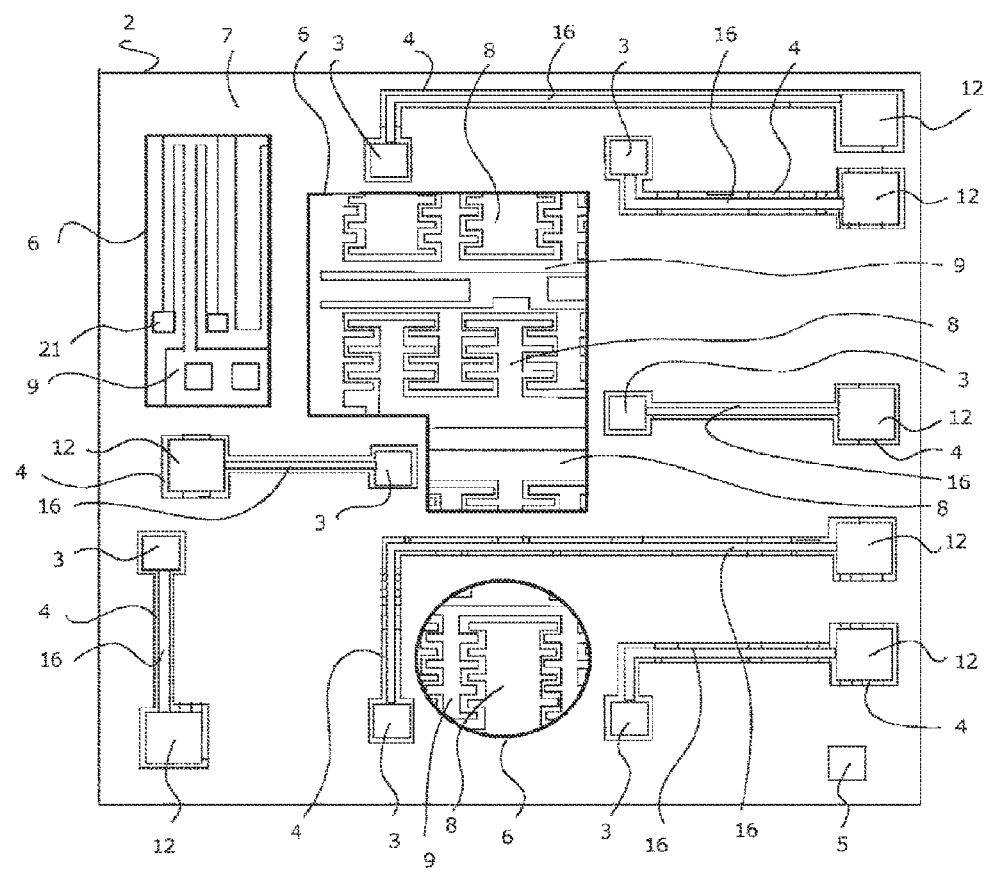
FIG. 8 is an elevation view of an electrode substrate according to the third embodiment of the present invention.

FIG. 8 is a plan view in which the electrode substrate 2 is superimposed on the device substrate illustrated in FIG. 7. By disposing the inside observation space 6 according to the present invention in the shield layer 7, a minute gap between comb teeth formed on the device substrate 15, a contact between the comb teeth (stick), a damage on a beam, a processing shape of a beam can be observed and confirmed.

As described above, a position of the inside observation space 6 formed in the shield layer 7 is preferably coincided with an essential portion to measure a physical quantity on the device substrate 15. A shape of the above-described space 6 may be polygonal or circle. In this structure, a processing state in a physical quantity sensor can be easily understood. In addition, even if the electrode pad 12 connected via the metal wiring 16 from a plurality of the through hole surface electrodes 3 is included, the shield layer 7 is formed around the wiring 16, and therefore noise generated by electromagnetic waves can be blocked if the shield layer 7 is not provided, a signal noise is generated by influence of an inside parasitic capacitance of the wiring 16, and also the substrate is affected by a signal delay.

Further, by forming the inside observation space 6, a parasitic capacitance or a stray capacitance with a silicon lower electrode can be reduced.

(Fourth Embodiment)

Figure 9:
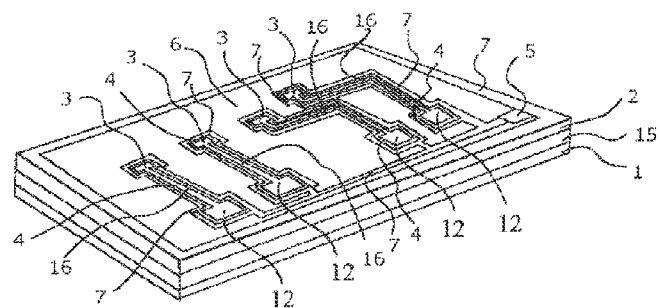
FIG. 9 is an external appearance view of a device substrate according to a fourth embodiment of the present invention.

A structure according to a fourth embodiment of the physical quantity sensor according to the present invention will be described with reference to FIG. 9. FIG. 9 is an external appearance view of the physical quantity sensor indicating another example of the present invention. A substrate at least has a three-layer structure including a fixed substrate 1, a device substrate 15, and an electrode substrate 2. In the embodiment, an acceleration sensor and an angular rate sensor are integrally formed in an individual room on the device substrate 15.

A plurality of through hole surface electrodes 3 is disposed on a surface of the electrode substrate 2 and electrically connected to an electrode pad 12 by a wiring 16. Peripheries of the through hole surface electrodes 3 are insulated by spaces 4, and shield layers 7 are formed around the peripheries. Further, the shield layers 7 are formed on an outer peripheral side of the electrode substrate so as to surround all of the electrodes 12 and the wirings 16. These shield layers 7 are connected to an earth electrode 5.

In this structure, the shield layer 7 includes an area formed on the outer peripheral side and an area formed around the wiring 16, and the inside observation space 6 is formed between the area formed on the outer peripheral side and the area formed around the wiring 16. Electromagnetic waves generating between the wirings 16 is blocked in the area formed around the wiring 16 in the shield layer 7. Electric noise caused by electromagnetic waves existing outside is blocked by the area formed on the peripheral side in the shield layer 7.

Figure 10:
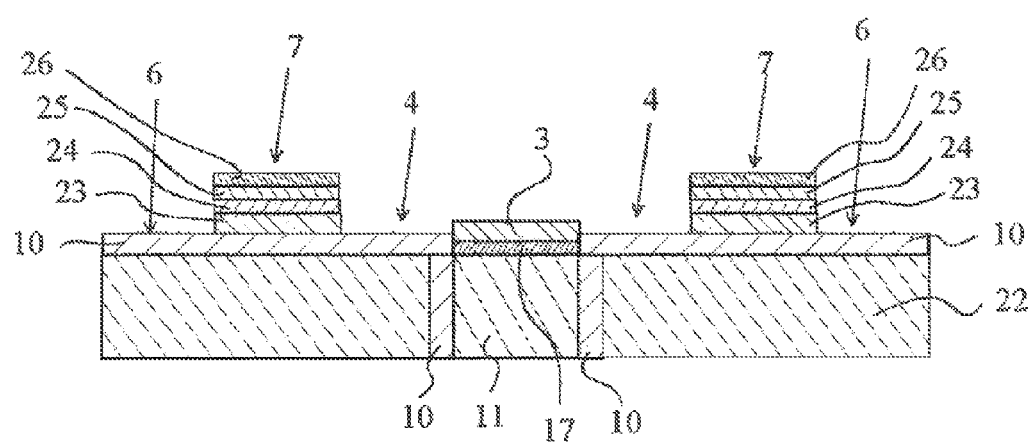
FIG. 10 is a sectional view around a shield portion according to the present invention.

A cross-section configuration of the inside observation space 6 according to the present invention will be described. FIG. 10 is a cross-section views around the inside observation space. The through wiring 11 is formed in a low resistance silicon 22. A side surface of the through wiring 11 is insulated by an insulating film 10. The insulating film 10 including SiO2 is provided on a surface of the low resistance silicon 22. The shield layer 7 includes a metal thin film 23 on the insulating film 10, a TEOS insulating film 24 on the metal thin film 23, a SiN (silicon nitride film) 25 on the TEOS insulating film 24, and a protective film 26 on the SiN 25. On the other hand, on the electrode substrate 2 in a portion in which the space 4 and the inside observation space 6 are provided, an insulation film is formed on the low resistance silicon 22. That is, the shield layer 7 is not formed or is removed. Further, in the through hole surface electrode 3 of the through wiring 11, Poly-Si is formed on a surface of the low resistance silicon 22, and a metal electrode is formed thereon. A sensor function is not affected in a structure in which a protective film 26 is not formed as a sensor.

As described above, the inside observation space 6 according to the present invention has the thinnest structure in a thickness direction. A material transmitting infrared rays and also an insulating material may be used in the inside observation space from a sectional direction.

As described above, by forming the inside observation space in the shield layer 7 formed on an electrode substrate surface, a defect can be detected by observing during a process, and therefore, costs can be reduced since the process is advanced to the final structure.

Further, even if a defect such as a contact between comb teeth is caused by cutting by a dicing device after being manufactured at a wafer level, the defect can be detected.

Furthermore, after each type physical quantity sensor is shipped at a product level, if the sensor is returned as a defective product, a defect factor can be easily detected, such as a defect analysis.

The acceleration sensor and the angular rate sensor are mounted in a vehicle and used to control a brake system in each embodiment described above. Further, these sensors can be used in attitude control of a farm machine. In addition, these sensors can be used in a MEMS structure to electrically measure a physical quantity of such as a pressure sensor and a light switch.

A physical quantity sensor excellent, in reliability can be provided by disposing the sensor in one package made of a ceramic material or a resin material with a control LSI.

The present invention is not limited to the above-described each embodiment and includes various variations. For example, the above-described embodiments describe the present invention in detail for clarification, and every configuration may not be necessarily included. Further, a configuration of the embodiments can be partially replaced with configurations of the other embodiments. Furthermore, a configuration of each embodiment can be added to configurations of the other embodiments. Further, a part of a configuration of each embodiment can be added to, deleted from, and replaced from other configurations.

REFERENCE SIGNS LIST

1 . . . fixed substrate, 2 . . . electrode substrate, 3 . . . through hole surface electrode, 4 . . . space, 5 . . . earth electrode, 6 . . . inside observation space, 7 . . . shield layer, 8 . . . fixed comb tooth, 8a fixed electrode, 9 . . . movable comb tooth, 9a . . . movable electrode, 10 . . . insulating film, 11 . . . through electrode, 12 . . . electrode pad, 13 . . . device layer, 14 . . . sensing space, 15 . . . device substrate, 16 . . . wiring, 17 . . . Poly-Si, 18 . . . line-of-electric force, 19 . . . driving direction, 20 . . . detecting direction, 21 . . . fixing portion, 22 . . . low-resistance silicon material, 23 . . . metal thin film, 24 . . . TEOS, 25 . . . SiN, 26 . . . protective film

The invention claimed is:

1. A physical quantity sensor, comprising:
a lamination structure in which a first substrate and a second substrate are laminated;
an electrode pad and a wiring formed on a surface of the first substrate;
a sensing portion formed on the second substrate; and
a conductive film formed on a surface of the first substrate, electrically insulated with respect to the electrode and the wiring, and held at a constant potential, wherein
the conductive film includes a peep portion to observe the sensing portion,
the sensing portion comprises movable comb teeth and fixed comb teeth,
a fixed electrode is formed in the second substrate and is electrically connected to a through hole surface electrode that is formed on an electrode substrate via a first electrode,
a movable electrode is formed in the second substrate and is electrically connected to a through hole surface electrode that is formed in the electrode substrate via a second electrode,
a fixed electrode is electrically connected to the fixed comb teeth,
a movable electrode is electrically connected to the movable comb teeth,
a sensing space is defined in the second substrate as a sealed space by the first substrate and the electrode substrate, and
in the sensing space, a pressure ranges from 10000 Pa to 50000 Pa.

2. The physical quantity sensor according to claim 1, wherein
a shield layer comprises the peep portion in an area where the fixed comb teeth and the movable comb teeth are projected with respect to the shield layer in a lamination direction.

3. The physical quantity sensor according to claim 1, wherein the peep portion is a thin wall portion in which a thickness of the shield layer is thinner than other portions or a portion in which the shield layer is not provided.

4. The physical quantity sensor according to claim 3, wherein all of a substrate material include a silicon material.

5. The physical quantity sensor according to claim 3, wherein the first substrate and the peep portion transmit infrared rays.

6. The physical quantity sensor according to claim 3, wherein the peep portion is polygonal.

* * * * *